(12) United States Patent
Kim (10) Patent No.: US 10,847,696 B2
(45) Date of Patent: Nov. 24, 2020

(54) DISPLAY DEVICE

(71) Applicant: Samsung Display Co., Ltd., Gyeonggi-do (KR)

(72) Inventor: Mugyeom Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/218,642

(22) Filed: Dec. 13, 2018

(65) Prior Publication Data

US 2019/0115516 A1 Apr. 18, 2019

Related U.S. Application Data

(62) Division of application No. 15/488,902, filed on Apr. 17, 2017, now Pat. No. 10,186,648.

(30) Foreign Application Priority Data

Apr. 15, 2016 (KR) .................. 10-2016-0046493

(51) Int. Cl.
| | | |
|---|---|---|
| *H01L 33/62* | (2010.01) | |
| *H01L 25/075* | (2006.01) | |
| *H01L 33/54* | (2010.01) | |
| *H01L 27/32* | (2006.01) | |
| *H01L 29/78* | (2006.01) | |

(Continued)

(52) U.S. Cl.
CPC .......... *H01L 33/62* (2013.01); *H01L 25/0753* (2013.01); *H01L 27/3281* (2013.01); *H01L 27/3288* (2013.01); *H01L 29/7842* (2013.01); *H01L 33/06* (2013.01); *H01L 33/54* (2013.01); *H01L 51/0097* (2013.01); *H01L 2933/0066* (2013.01)

(58) Field of Classification Search
CPC . H01L 33/62; H01L 51/0097; H01L 29/7842; H01L 27/3281; H01L 27/3288; H01L 33/06; H01L 33/54; H01L 25/0753
See application file for complete search history.

(56) References Cited

U.S. PATENT DOCUMENTS

| | | |
|---|---|---|
| 5,469,020 A | 11/1995 | Herrick |
| 5,962,967 A | 10/1999 | Kiryuschev et al. |
| 8,729,524 B2 | 5/2014 | Rogers et al. |

(Continued)

FOREIGN PATENT DOCUMENTS

| | | |
|---|---|---|
| JP | 2008251531 A | 10/2008 |
| KR | 1020150135721 A | 12/2015 |
| KR | 1020160042322 A | 4/2016 |

*Primary Examiner* — Galina G Yushina
(74) *Attorney, Agent, or Firm* — Cantor Colburn LLP (57) ABSTRACT

A display device includes a display substrate including: a pixel area provided in plurality separated from each other, and a plurality of through holes separated from each other; a light-emitting diode provided in plurality on the display substrate arranged in the pixel areas thereof; and a wiring line connected to the plurality of light-emitting diodes. A length of the wiring line extends in one direction of the display substrate, and the wiring line includes arranged along the length thereof a plurality of planar portions respectively contacting the display substrate, and a curved portion which connects adjacent planar portions to each other. The wiring line is connected to a light-emitting diode among the plurality of light-emitting diodes at the curved portion.

11 Claims, 9 Drawing Sheets

(51) Int. Cl.
  *H01L 51/00* (2006.01)
  *H01L 33/06* (2010.01)

(56) References Cited

U.S. PATENT DOCUMENTS

| | | |
|---|---|---|
| 8,905,772 B2 | 12/2014 | Rogers et al. |
| 9,252,395 B2 | 2/2016 | Oh |
| 2002/0068373 A1 | 6/2002 | Lo .................. H01L 33/0062 438/33 |
| 2008/0217648 A1 | 9/2008 | Ohara |
| 2008/0218369 A1 | 9/2008 | Krans ................. A47G 9/1045 340/691.1 |
| 2009/0267085 A1 | 10/2009 | Lee ....................... F21K 9/00 257/88 |
| 2015/0028373 A1 | 1/2015 | Abe ...................... H01L 33/56 257/98 |
| 2015/0155459 A1 | 6/2015 | Ishihara .............. H01L 25/0753 362/294 |
| 2015/0179905 A1 | 6/2015 | Ohmae ............ G02F 1/133603 257/88 |
| 2015/0187729 A1* | 7/2015 | Chew .................... H01L 24/85 257/784 |
| 2016/0104756 A1* | 4/2016 | Lee ..................... H01L 27/3276 257/40 |
| 2016/0300745 A1* | 10/2016 | Chang ................ H01L 25/0753 |

* cited by examiner

DISPLAY DEVICE

This application is a divisional application of U.S. application Ser. No. 15/488,902 filed Apr. 17, 2017, which claims priority to Korean Patent Application No. 10-2016-0046493, filed on Apr. 15, 2016, and all the benefits accruing therefrom under 35 U.S.C. § 119, the contents of which in their entirety are herein incorporated by reference.

BACKGROUND

1. Field

One or more embodiments relate to a display device.

2. Description of the Related Art

A light-emitting diode ("LED") is a semiconductor device in which when a voltage is applied to a P-N diode of the LED in a forward direction, a hole and an electron are injected then recombined, and energy generated by recombination of the hole and the electron is converted to light energy.

The LED may be used for mobile apparatuses such as smart phones, lap-top computers, digital cameras, camcorders, personal digital assistants ("PDA"s), tablet personal computers ("PC"s), watches, or electronic apparatuses such as desk-top computers, televisions, outdoor billboards, display devices for exhibition, dashboards for automobiles, and head up displays ("HUD"s).

SUMMARY

One or more embodiments include a display device in which a light-emitting diode is relatively easily connected to a wiring line.

According to one or more embodiments, a display device includes: a display substrate including: a pixel area provided in plurality separated from each other, and a plurality of through holes separated from each other; a light-emitting diode provided in plurality arranged on the display substrate in the pixel areas thereof; and a wiring line provided in plurality on the display substrate including a first wiring line and a second wiring line which are each electrically connected to the light-emitting diode.

Each light-emitting diode may include at least one first contact electrode, at least one second contact electrode, and a p-n diode between the at least one first contact electrode and the at least one second contact electrode, the at least one first contact electrode being electrically connected to the first wiring line, and the at least one second contact electrode being electrically connected to the second wiring line.

The first wiring line and the second wiring line may be arranged in different layers on the display substrate and cross each other.

For a same light-emitting diode to which the first and second wiring lines are connected, the first wiring line and the light-emitting diode may form a first contact point in at least two first regions of the light-emitting diode, and the second wiring line and the light-emitting diode may form a second contact point in at least two second regions of the light-emitting diode different from the first regions.

The first wiring line may include a curve and lengthwise extend over pixel areas arranged in a first direction of the display substrate, and the second wiring line may include a curve and lengthwise extend over pixel areas arranged in a second direction of the display substrate which crosses the first direction.

In a top plan view, the first wiring line may lengthwise extend as a zigzag type line over pixel areas arranged in a first direction of the display substrate, and the second wiring line may lengthwise extend as a zigzag type line over pixel areas arranged in a second direction of the display substrate which crosses the first direction.

The display device may further include insulating layers alternated with the first wiring line and the second wiring line in a thickness direction of the display substrate, and contact holes defined spaced apart from each other in the insulating layers. The first wiring line and the second wiring line may be respectively electrically connected to the at least one first contact electrode and the at least one second contact electrode, via the contact holes in the insulating layers.

The first wiring line and the second wiring line in different layers on the display substrate define a height difference therebetween, and a same light-emitting diode to which the first and second wiring lines are connected may have a step difference corresponding to the height difference between the first wiring line and the second wiring line.

The at least one first contact electrode and the at least one second contact electrode may each be disposed at a bottom of the p-n diode which faces the display substrate, and the bottom of the p-n diode may define the step difference corresponding to the height difference between the first wiring line and the second wiring line.

The insulating layers may include: a first insulating layer between the first wiring line and the second wiring line, and a second insulating layer between the second wiring line and the light-emitting diode. The first wiring line may be electrically connected to the first contact electrode via a first contact hole in the first and second insulating layers, and the second wiring line may be electrically connected to the second contact electrode via a second contact hole in the second insulating layer.

The display device may further include: a barrier layer in the pixel areas, the barrier layer being between the display substrate and the first wiring line which are respectively in the pixel areas.

The display device may further include an individual sealing layer respectively on each of the light-emitting diodes arranged in the pixel areas.

A length of the wiring line may extend in one direction of the display substrate and may include arranged along the length thereof: a planar portion provided in plurality respectively contacting the display substrate, and a curved portion which connects adjacent planar portions to each other.

The curved portion may protrude from an end of each of the adjacent planar portions to be spaced apart from the display substrate in a thickness direction of the display substrate.

The curved portion may be provided in plurality alternating with the plurality of planar portions, and each of the light-emitting diodes arranged in the pixel areas.

The first wiring line may include a first planar portion provided in plurality and a first curved portion connecting adjacent first planar portions to each other, and the second wiring line may include a second planar portion provided in plurality and a second curved portion connecting adjacent second planar portions to each other. For a same light-emitting diode to which the first and second wiring lines are connected, the first curved portion may be electrically connected to the first contact electrode of the light-emitting diode, and the second curved portion may be electrically connected to the second contact electrode of the light-emitting diode.

The display substrate may further include an island region provided in plurality spaced apart from each other along the display substrate and at which the wiring line contacts the display substrate, and the first planar portion of the first wiring line and the second planar portion of the second wiring line may be respectively bonded to the island regions of the display substrate.

The display substrate may be bendable, curvable or rollable along a direction, each of the plurality of through holes may pass through a thickness the display substrate, and in a top plan view of the display substrate, each of the through holes may have a length which extends in the direction in which the display substrate is bendable, curvable or rollable.

In the top plan view: each of the plurality of through holes may define a width perpendicular to the length thereof and opposing ends thereof along the length thereof, and the width of each through hole at both of the opposing ends thereof may be greater than at remaining portions thereof.

The first wiring line and the second wiring may be respectively applied with electric signals, and for a same light-emitting diode to which the first and second wiring lines are connected, the light-emitting diode may be applied with the electrical signals and emit light.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

As the present disclosure allows for various changes and numerous embodiments, exemplary embodiments will be illustrated in the drawings and described in detail in the written description. An effect and a characteristic of the present disclosure, and a method of accomplishing these will be apparent when referring to embodiments described with reference to the drawings. This present disclosure may, however, be embodied in many different forms and should not be construed as limited to the exemplary embodiments set forth herein.

Hereinafter, the present disclosure will be described more fully with reference to the accompanying drawings, in which exemplary embodiments of the present disclosure are shown. When description is made with reference to the drawings, like reference numerals in the drawings denote like or corresponding elements, and repeated description thereof will be omitted.

It will be understood that when a layer, region, or component is referred to as being "on," another layer, region, or component, it can be directly or indirectly on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto. As used herein, one element described as "connected" to a second element may be in physical and/or electrical connection with the second element.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper,"

depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a display device according to an embodiment will be described more fully with reference to the accompanying drawings, in which embodiments of the present disclosure are shown. When description is made with reference to the drawings, like reference numerals in the drawings denote like or corresponding elements, and repeated description thereof will be omitted.

Figure 1:
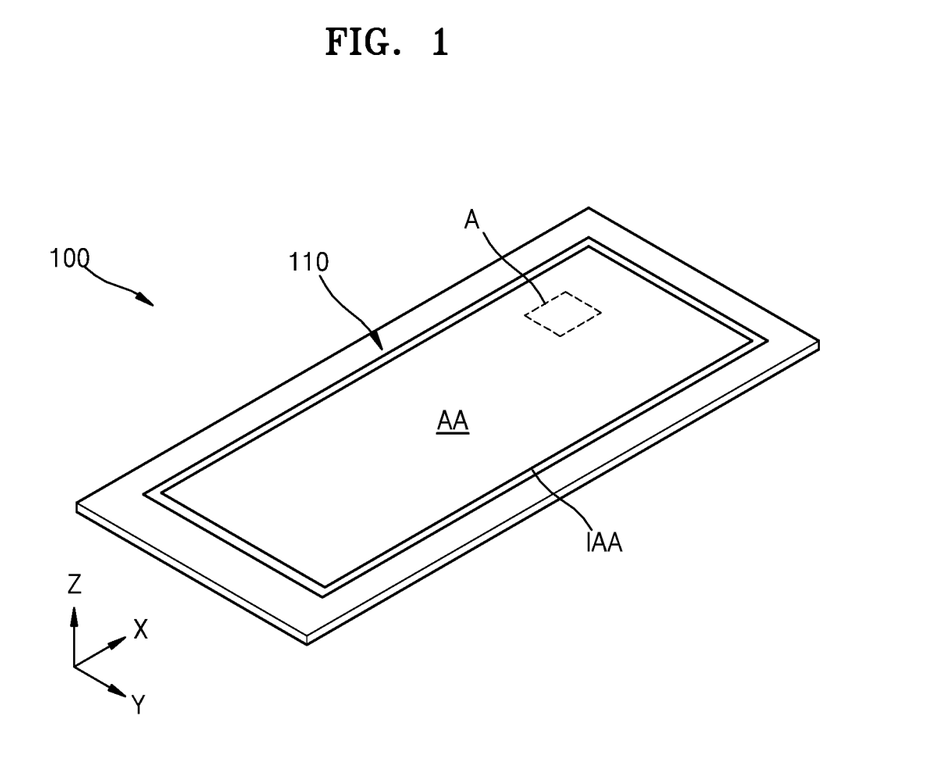
FIG. 1 is a perspective view of an embodiment of a display device according to the invention.

FIG. 1 is a perspective view of an embodiment of a display device 100 according to the invention.

Referring to FIG. 1, the display device 100 includes a display panel 110 which generates and displays an image at a viewing side of the display device 100. The display panel 110 may be a flexible panel.

The display panel 110 includes an active area AA at which the image is generated and displayed and an inactive area IAA extending from outer edges of the display panel 110 to the outside of the active area AA. In an embodiment, the inactive area IAA surrounds the active area AA in the top plan view.

Figure 2:
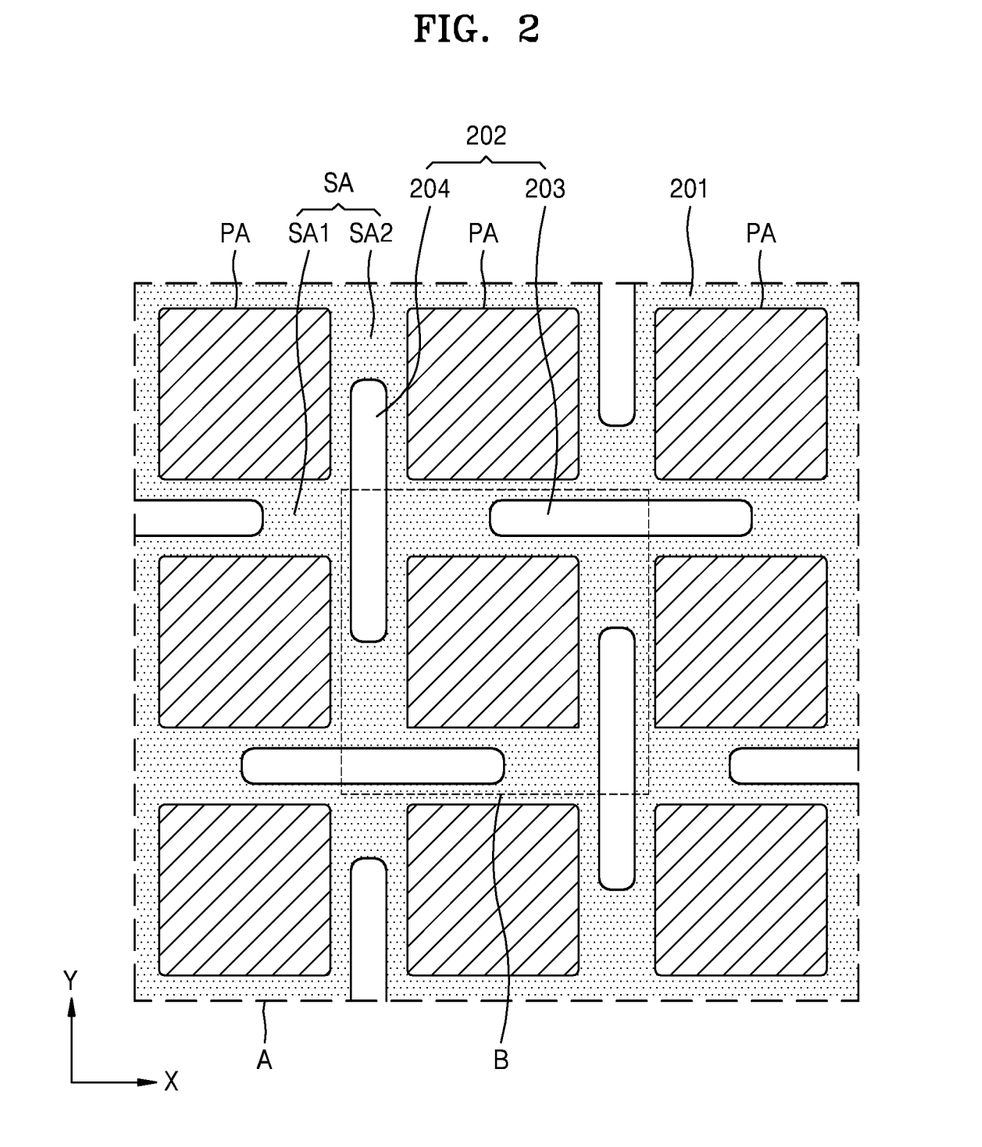
FIG. 2 is an enlarged top plan view of portion A of FIG. 1.

FIG. 2 is an enlarged top plan view of portion A of the display panel 110 of FIG. 1.

Referring to FIG. 2, a pixel area PA provided in plurality may be defined or disposed on a display substrate 201 of the display panel 110. The display substrate 201 may be one of a flexible glass substrate and a flexible polymer substrate. The display substrate 201 may be transparent, semi-transparent or opaque.

The pixel areas PA may be spaced apart from each other by a predetermined interval in the active area AA (see FIG. 1) of the display substrate 201. A light-emitting element such as a light-emitting diode ("LED") may be disposed on the display substrate 201 in the pixel area PA thereof to generate and emit light. A separation area SA may be between adjacent pixel areas PA.

The separation area SA includes a first separation area SA1 defining a length thereof extending in an X-direction and a second separation area SA2 defining a length thereof extending in a Y-direction. The length of the respective separation areas is larger than a width thereof. The X-direction may cross the Y-direction. The first separation area SA1 may separate a plurality of pixel areas PA arranged in the Y-direction, and the second separation area SA2 may separate a plurality of pixel areas PA arranged in the X-direction.

A plurality of through holes 202 may be in the separation area SA. The through holes 202 may each pass through the display substrate 201, such as completely through a thickness of the display substrate 201 taken in a Z-direction which is perpendicular to both the X-direction and Y-direction.

The display panel 110 may be bent, curved or rolled in a direction, such as in the X-direction or the Y-direction indicated in FIG. 1, but not being limited thereto. The display panel 110 (and consequently the display device 100 may be bent, curved or rolled in a diagonal direction including both the X-direction and the Y-direction simultaneously. The through holes 202 may extend in a direction in which the display substrate 201 is bent, curved or rolled. In an embodiment, the through holes 202 may define a shape thereof in the top plan view having a length with is larger than a width, such that the through holes 202 has a shape which extends long in the separation area SA.

The plurality of through holes 202 collectively includes a first through hole 203 in the first separation area SA1 and a second through hole 204 in the second separation area SA2. The first and second through holes 203 and 204 may provided in plurality within the separation area SA. In an embodiment of manufacturing the display device 100, the through holes 202 may be formed by laser drilling, but not being limited thereto.

Since the through holes 202 are in the separation area SA of the display substrate 201 which separates adjacent pixel areas PA thereof, transformation of the display substrate 201, for example, bending, curving and rolling of the display substrate 201 may be relatively easily performed. In other words, where the display device 100 (see FIG. 1) to which the display substrate 201 is applied is used as a stretchable display device, the display device 100 may have relatively high flexibility and reduce abnormal transformation owing to the reduced volume of the display substrate 201 by the material thereof being absent at positions of the through holes 202.

Furthermore, since a plurality of through holes 202 are extended completely through a thickness of the display substrate 201, an overall weight of the display substrate 201 may be reduced since material of the display substrate 201 is absent at the through holes 202. Therefore, the flexibility of the display substrate 201 may improve.

Figure 3:
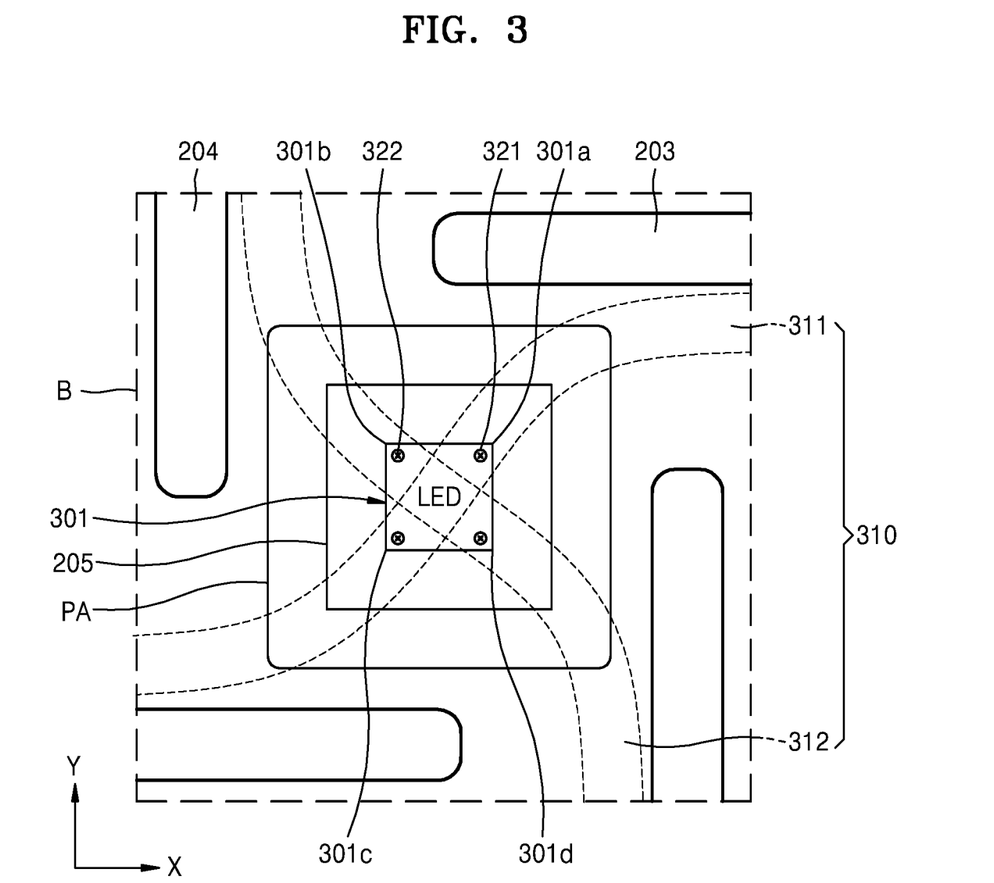
FIG. 3 is an enlarged top plan view of portion B of FIG. 2.

FIG. 3 is an enlarged top plan view of portion B of FIG. 2.

Referring to FIG. 3, an LED 301 may be in the pixel area PA. The LED 301 may be provided in plurality within the active area AA. In an embodiment, the LED 301 may generate and emit light of a predetermined wavelength within a wavelength range from an ultraviolet ("UV") light ray to visible light. The LED 301 may be a micro LED. In an embodiment, the LED 301 may include at least one of a red LED, a green LED, a blue LED, a white LED and a UV LED.

A plurality of wiring lines 310 may be disposed on the display substrate 201. The wiring lines 310 may not overlap through holes 203 and 204 which are defined in the display substrate 201.

The wiring lines 310 may be electrically connected to one or more of the LED 301 in the active area AA. The display device 100 may be driven by a passive matrix ("PM") method to generate and display the image. In an embodiment, for example, since the LED 301 is a micro LED, the LED 301 may have a relatively high speed response. Therefore, the display device 100 may be driven by the PM method having a relatively simple structure. In another embodiment, the display device 100 may be driven by an active matrix ("AM") method to generate and display the image.

The wiring lines 310 collectively include a first wiring line 311 and a second wiring line 312. The first wiring line 311 and the second wiring line 312 may be disposed on and/or on different insulating layers (not shown) of the display panel 110, such that the first and second wiring lines 311 and 312 are insulated from each other. The LED 301 may emit light when electric signals applied to the first wiring line 311 and the second wiring line 312, respectively, are further applied to the LED 301. Each of the first and second wiring lines 311 and 312 may define a length thereof which is larger than a width thereof. The width of the wiring line may be taken in a direction normal to an extension direction of the length thereof at a particular point of the wiring line.

The length of the first wiring line 311 may extend over a plurality of pixel areas PA which are spaced apart in the X-direction of the display substrate 201. The length of the first wiring line 311 may have at least a curve in the top plan view. In an embodiment, the first wiring line 311 may be a curved type line. The first wiring line 311 and/or the second wiring line 312 may be defined by an entirely planar portion which is not spaced apart from an underlying layer in a thickness direction of the display device, but the invention is not limited thereto.

The length of the second wiring line 312 may extend over a plurality of pixel areas PA which are spaced apart in the Y-direction of the display substrate 201. Like the first wiring line 311, the second wiring line 312 may be a curved type line.

The first wiring line 311 may cross the second wiring line 312 in the top plan view. In an embodiment, the first wiring line 311 may cross the second wiring line 312 in a region in which the LED 301 is arranged. In an embodiment, a crossing point of the first and second wiring lines 311 and 312 may overlap the LED 301.

Specifically, the length of the first wiring line 311 may extend across the LED 301 from a first corner 301a of the LED 301 to a third corner 301c, which is located in the diagonal direction relative to the first corner 301a. The length of the second wiring line 312 may extend across the LED 301 from a second corner 301b to a fourth corner 301d, which is located in the diagonal direction relative to the second corner 301b. The first wiring line 311 may cross the second wiring line 312 in the central region of the LED 301, but is not limited thereto.

To improve a contact characteristic therebetween, the LED 301 may be electrically connected to the wiring lines 310 in at least two regions. In an embodiment, for example, the LED 301 and the first wiring line 311 may form a first contact point 321 in plurality respectively at the first corner 301a and the third corner 301c. The LED 301 and the second wiring line 312 may form a second contact point 322 in plurality respectively at the second corner 301b and the fourth corner 301d.

A sealing layer 205 may be disposed over the display substrate 201. The sealing layer 205 includes at least one inorganic layer. In an embodiment of manufacturing the display device 100, the sealing layer 205 may be formed by an inkjet process. In an embodiment, the sealing layer 205 as a discrete element may individually cover a single LED 301 disposed in each pixel area PA. In another embodiment, a single sealing layer 205 may cover adjacent pixel areas PA simultaneously so as to be commonly covering more than one LED 301 across the adjacent pixel areas PA.

In an embodiment, the first wiring line 311 and the second wiring line 312 may be in or on different insulating layers among layers of the display device 100 which area disposed on the display substrate 201. The layers of the display device 100 are disposed in the Z-direction (e.g., vertical or thickness direction) of the display device 100.

Figure 4:
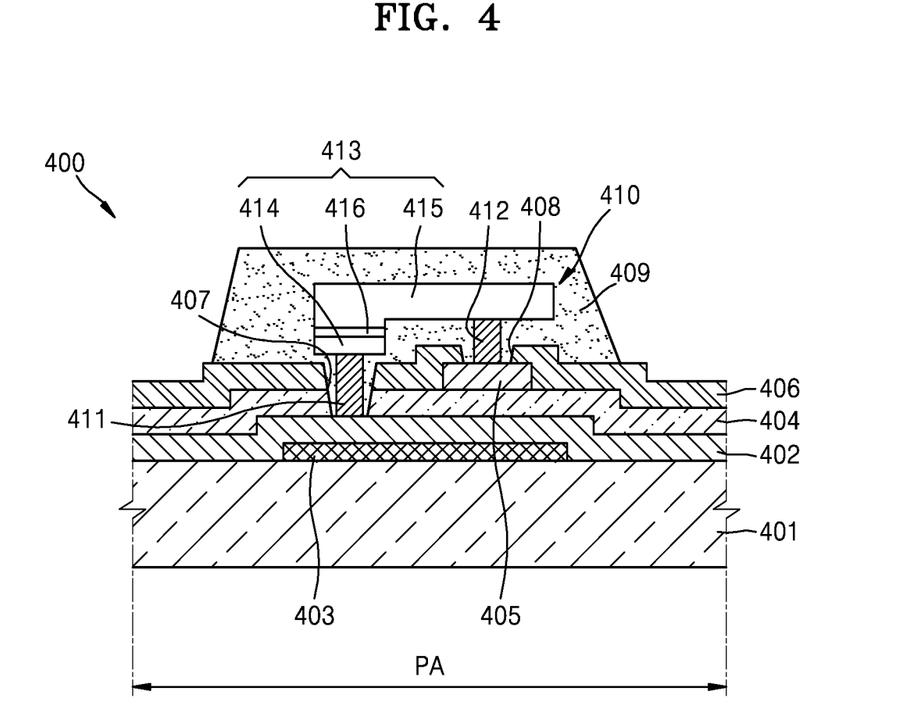
FIG. 4 is a cross-sectional view of an embodiment of one pixel area of a display device according to the invention.

FIG. 4 is a cross-sectional view of an embodiment of one pixel area PA of a display device 400 according to the invention.

Referring to FIG. 4, the display device 400 includes a display substrate 401 (refer to 201 of FIG. 2) on which layers of the display device 400 are disposed. The display substrate 401 may include a flexible material.

A first wiring line 402 (refer to 311 in FIG. 3) may be on the display substrate 401. The length of the first wiring line 402 may extend over pixel areas PA spaced apart from each other in one direction of the display substrate 401. In FIG. 4, the length of the first wiring line 402 extends in the horizontal (e.g., left-to-right) direction of the display substrate 401.

A barrier layer 403 may be between the display substrate 401 and the first wiring line 402. The barrier layer 403 includes at least one inorganic layer. The barrier layer 403 may be in a region corresponding to each pixel area PA. A region of the display substrate 401 at which the barrier layer 403 is not arranged may be relatively easily bent owing to the absence of the barrier layer 403 at that region.

A first insulating layer 404 may be on the first wiring line 402. The first insulating layer 404 covers the first wiring line 402.

A second wiring line 405 (refer to 312 in FIG. 4) may be on the first insulating layer 404. The length of the second wiring line 405 may extend over pixel areas PA spaced apart from each other in another direction of the display substrate 401. In FIG. 4, the length of the second wiring line 405 extends into the page.

The first wiring line 402 may cross the second wiring line 405. The length directions of the first and second wiring lines 402 and 405 cross each other, such as the X-direction and Y-direction cross each other (refer to FIG. 1).

A second insulating layer 406 may be on the second wiring line 405. The second insulating layer 406 covers the second wiring line 405.

As described above, the first wiring line 402, the first insulating layer 404, the second wiring line 405 and the second insulating layer 406 may be stacked in the vertical (e.g., thickness) direction of the display substrate 401. Referring to FIGS. 1 and 4, the thickness direction is indicated in the Z-direction.

An LED 410 (refer to 301 in FIG. 4) may be in the pixel area PA.

The LED 410 includes a first contact electrode 411, a second contact electrode 412, and a p-n diode 413 between the first and second contact electrodes 411 and 412.

The first and second contact electrodes 411 and 412 may include conductive paste or a conductive ball.

The p-n diode 413 includes a lower p-doped layer 414, an upper n-doped layer 415, and at least one quantum well layer 416 between the p-doped layer 414 and the n-doped layer 415. In an embodiment, the upper doped layer 415 may be a p-doped layer, and the lower doped layer 414 may be an n-doped layer.

The LED 410 may have various structures.

In an embodiment, the LED 410 may be a horizontal LED. In the horizontal LED, both the first and second contact electrodes 411 and 412 may face the same direction relative to the p-n diode 413. Specifically, the first and second contact electrodes 411 and 412 may both be arranged toward the display substrate 401 among sides of the LED 410.

In another embodiment, the LED 410 may be a vertical LED in which the first and second contact electrodes 411 and 412 are respectively located above and under the p-n diode 413 in a thickness direction of the LED 410.

In another embodiment, the first and second contact electrodes 411 and 412 may be respectively provided as a plurality of first and second contact electrodes in the horizontal direction or in the vertical direction of a single LED 401.

The first wiring line 402 and the second wiring line 405 may be in different layers of the display device 400 among layers thereof arranged in the vertical (e.g., thickness) direction of the display substrate 401. The first wiring line 402 may be electrically connected to the first contact electrode 411 at a first contact hole 407 defined in the first and second insulating layers 404 and 406. In an embodiment of manufacturing the display device 400, the first contact hole 407 may be formed by removing a portion of the first insulating layer 404 and a portion of the second insulating layer 406 each at a location of the first contact hole 407. The second wiring line 405 may be electrically connected to the second contact electrode 412 at a second contact hole 408 defined in the second insulating layer 406. In an embodiment of manufacturing the display device 400, the second contact hole 408 may be formed by removing a portion of the second insulating layer 406 at a location of the second contact hole 408.

Since the first and second wiring lines 402 and 405 have a height difference in the thickness direction, a connection of the first contact electrode 411 to the first wiring line 402, and a connection of the second contact electrode 412 to the second wiring line 405 may be relatively difficult. To facilitate the connections between these elements, the LED 410 may have a structure defining a step difference in the thickness direction corresponding to the height difference between the first wiring line 402 and the second wiring line 405. A distance in the thickness direction from an uppermost surface of the first wiring line 402 to a common reference such as the display substrate 401, may be smaller than that from an uppermost surface of the second wiring line 405 to define the height difference.

Specifically, the first contact electrode 411 may be disposed under the lower p-doped layer 414. In an embodiment of manufacturing the display device, material layers for forming the lower p-doped layer 414 and the quantum well layer 416 may be initially disposed overlapping a whole surface of a material layer for forming the upper n-doped layer 415. A portion of the material layer for forming the upper n-doped layer 415 may be exposed by removing a portion of the lower p-doped layer 414 material layer and a portion of the quantum well layer 416 material. The removing of such material layers may form the upper n-doped layer 415 having a stepped shape as illustrated in FIG. 4. A distance in the thickness direction from the lower p-doped layer 414 to a common reference such as the display substrate 401, may be smaller than that from the upper n-doped layer 415 to define the step difference. The second contact electrode 412 may be under the exposed portion of the n-doped layer 415.

Since the step difference of the p-n diode 413 corresponding to the height difference between the first wiring line 402 and the second wiring line 405 is formed below the p-n diode 413 as described above, the LED 410 is horizontally arranged with respect to a plane in which the display substrate 401 is arranged (e.g., a plane defined by the X-direction and the Y-direction, referring to FIG. 1), and the LED 410 may be relatively easily connected to the first wiring line 402 and the second wiring line 405.

Referring to FIG. 3, to improve a contact characteristic therebetween, the LED 410 may be electrically connected to the wiring lines in at least two regions of the LED 410. In an embodiment, for example, the LED 410 in FIG. 4 and the first wiring line 402 may form a first contact point (refer to 321 in FIG. 3) in plurality respectively at first and third corners of the LED 410. The LED 410 and the second wiring line 405 may form a second contact point (refer to 322 of FIG. 3) in plurality respectively at the second and fourth corners of the LED 410. A contact point may be defined as a location in the top plan view at which the LED and the wiring line and contact each other. In FIG. 4, for example, the first contact electrode 411 and the first wiring line 402 form a first contact point at a location of contact therebetween, and the second contact electrode 412 and the second wiring line 405 form a second contact point at a location of contact therebetween.

A sealing layer 409 (refer to 205 in FIG. 3) may be over the display substrate 401. The sealing layer 409 includes at least one inorganic layer. The sealing layer 409 as a discrete element may individually cover the LED 410 arranged in each pixel area PA.

Figure 5:
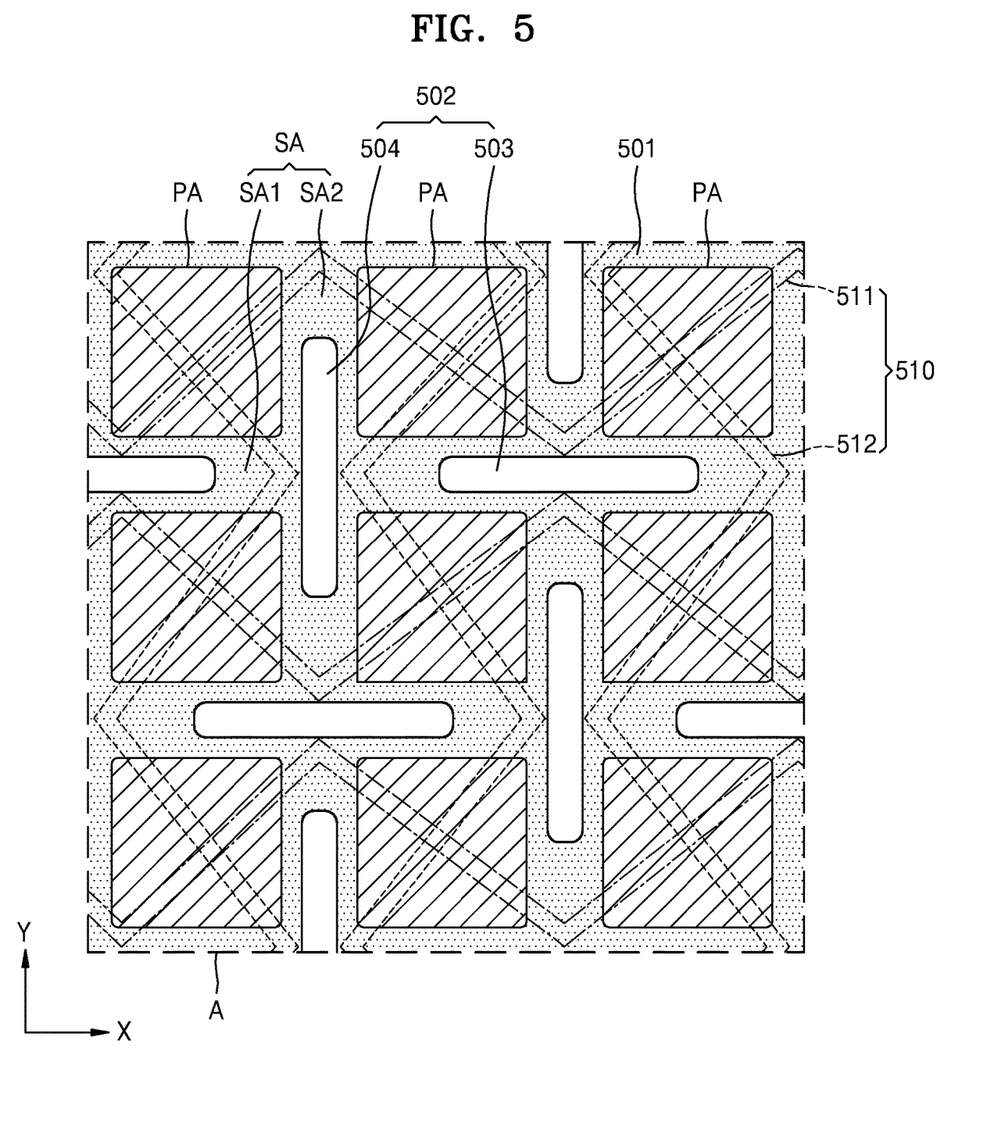
FIG. 5 is an enlarged top plan view of another embodiment of portion A of the display device in FIG. 1 according to the invention.

FIG. 5 is an enlarged top plan view of another embodiment of portion A of the display device in FIG. 1 according to the invention.

Referring to FIG. 5, a plurality of pixel areas PA may defined or disposed on a display substrate 501. A light-emitting element such as an LED may be in the pixel area PA. A separation area SA may be between adjacent pixel areas PA.

The separation area SA includes a first separation area SA1 lengthwise extending in an X-direction and a second separation area SA2 lengthwise extending in a Y-direction. A plurality of through holes 502 may be in the separation area SA. The through holes 502 may lengthwise extend in a direction in which the display substrate 501 is bent, curved or rolled. The through holes 502 collectively include a first through hole 503 in the first separation area SA1 and a second through hole 504 in the second separation area SA2. The first and second through holes 503 and 504 may provided in plurality within the separation area SA.

A plurality of wiring lines 510 connected to an LED (not shown) may be on the display substrate 501. The wiring lines 510 collectively include a first wiring line 511 and a second wiring line 512. As described above, the first wiring line 511 and the second wiring line 512 may be disposed on or in different insulating layers (not shown). The LED may emit light when electric signals applied to the first wiring line 511 and the second wiring line 512, respectively.

The first wiring line 511 may lengthwise extend over a plurality of pixel areas PA spaced apart in an X-direction of the display substrate 501. The first wiring line 511 may have at least a curve. In an embodiment, the first wiring line 511 may have a zigzag shape in the top plan view. The first wiring line 511 having the zigzag shape does not overlap the plurality of through holes 502. The first wiring line 511 and/or the second wiring line 512 may be defined by an entirely planar portion which is not spaced apart from an underlying layer in a thickness direction of the display device, but the invention is not limited thereto.

The second wiring line 512 may lengthwise extend over a plurality of pixel areas PA spaced apart in a Y-direction of the display substrate 501. The second wiring line 512 may have a zigzag shape. The second wiring line 512 having the zigzag shape does not overlap the plurality of through holes 502.

In an embodiment, the first wiring line 511 may cross the second wiring line 512.

In another embodiment, the first and second wiring lines 511 and 512 may be electrically connected to an LED via contact holes (not shown). In an embodiment of manufacturing a display device, the contact holes may be formed by removing portions of the insulating layers above, below and/or between different-layer wiring lines.

Figure 6:
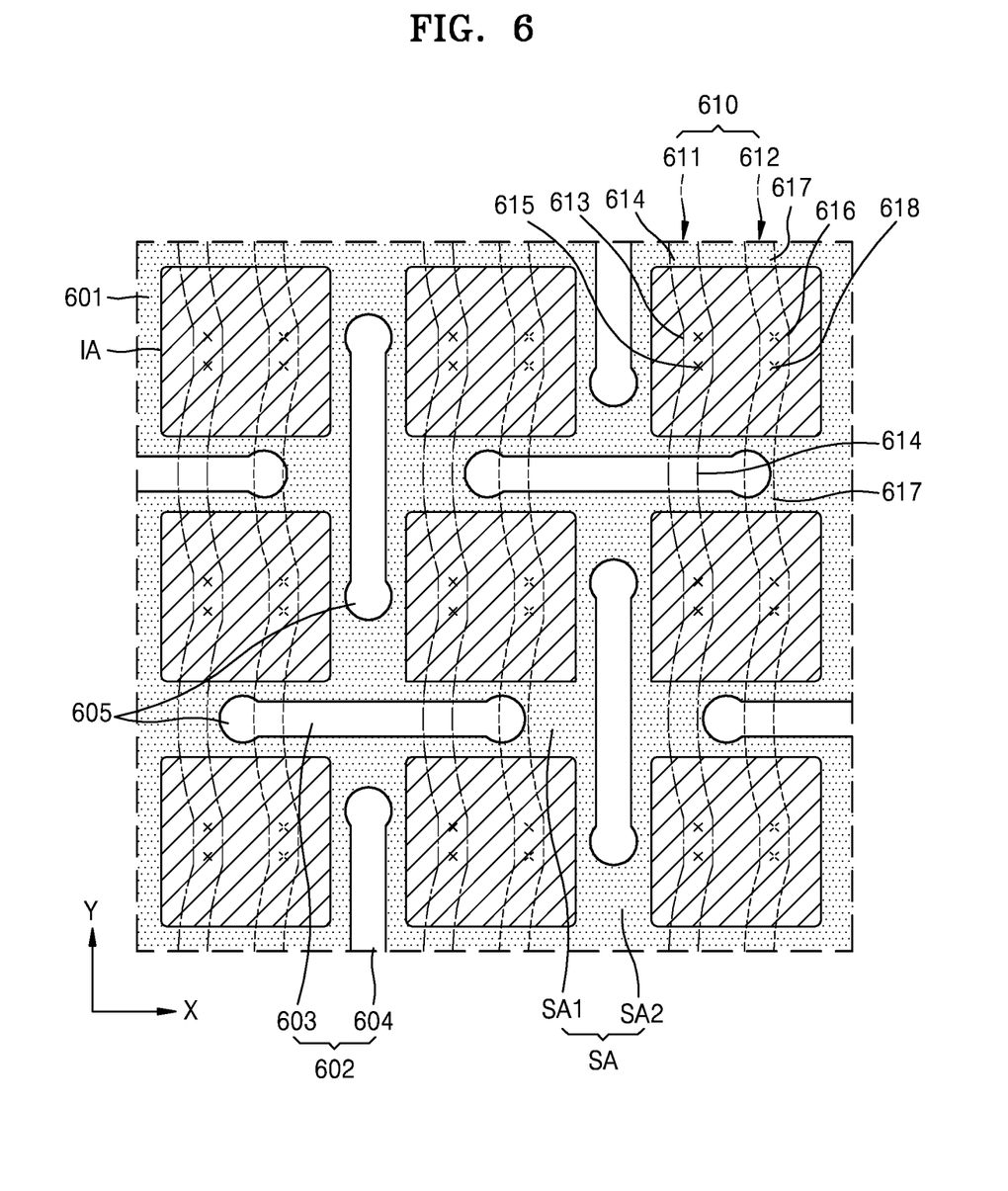
FIG. 6 is an enlarged top plan view of an embodiment of a region of a display substrate of a display device according to the invention.
Figure 7:
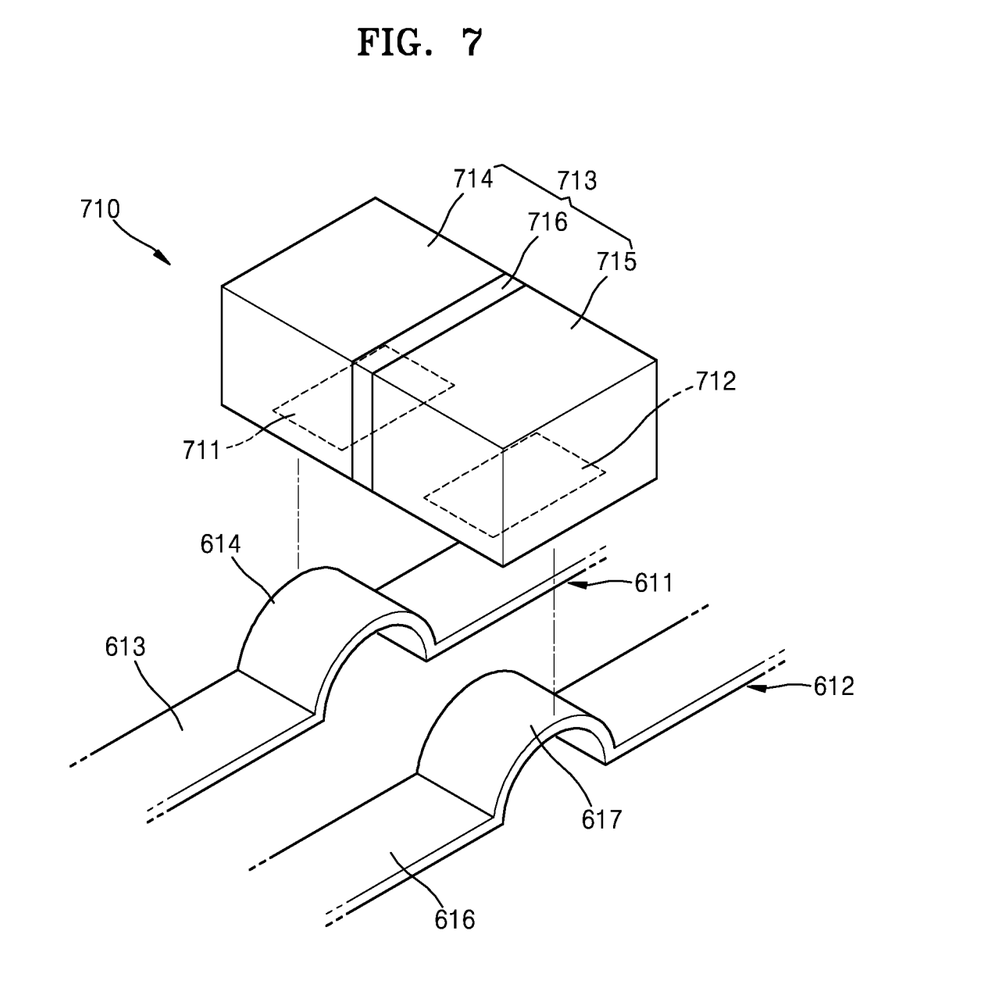
FIG. 7 is an exploded perspective view of a wiring line and a light-emitting diode ("LED") in an island area of FIG. 6.
Figure 8:
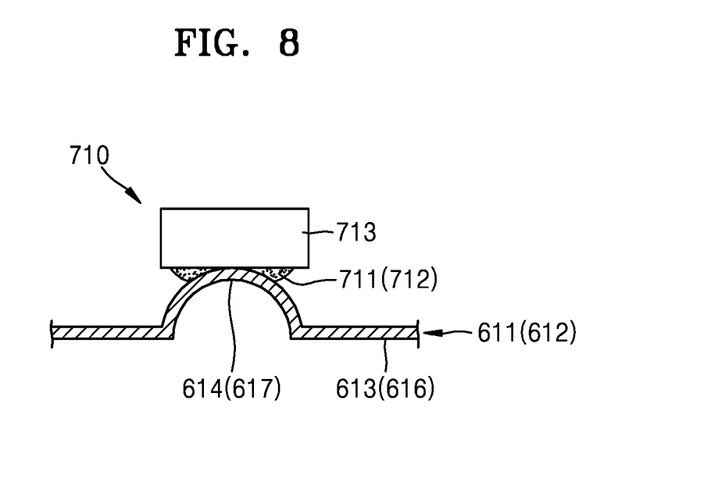
FIG. 8 is a cross-sectional view illustrating an embodiment of a connection between the wiring line and the LED of FIG. 7.

FIG. 6 is an enlarged top plan view of an embodiment of a region of a display substrate of a display device according to the invention, FIG. 7 is an exploded perspective view of a wiring line and an LED in an island area of FIG. 6, and FIG. 8 is a cross-sectional view illustrating an embodiment of a connection between the wiring line and the LED of FIG. 7. In an embodiment, the view of FIG. 6 may correspond to portion A in FIG. 1.

Referring to FIGS. 6 to 8, a plurality of island areas IA may be disposed on a display substrate 601. The island area IA may be an area at which the wiring line 610 may directly contact the display substrate 601.

A separation area SA may be between adjacent island areas IA. The separation area SA includes a first separation area SA1 lengthwise extending in an X-direction and a second separation area SA2 lengthwise extending in a Y-direction. A plurality of through holes 602 may be in the separation area SA. The through holes 602 may each lengthwise extend in a direction in which the display substrate 601 is bent, curved or rolled. The through holes 602 collectively include a first through hole 603 in the first separation area SA1 and a second through hole 604 in the second separation area SA2.

A through hole enlarged portion 605 may be defined at both of opposing ends of a single one among the through holes 602. Each through hole enlarged portion 605 may be a region in which a size of the through hole is greater than at remaining regions of the same through hole. In an embodiment, each of the plurality of through holes 602 defines a width perpendicular to the length thereof. The width of each through hole at both of the opposing ends thereof is greater than a width of remaining portions of the each through hole. Since the through hole enlarged portions 605 are defined at both of the opposing ends of respective through holes 602, the display substrate 601 may be bent, curved or rolled in the length direction of the through holes 602 more easily.

A plurality of wiring lines 610 may be disposed on the display substrate 601. An LED 710 may be electrically connected to the wiring lines 610. The wiring lines 610 collectively include a first wiring line 611 and a second wiring line 612. The first and second wiring lines 611 and 612 may be provided in plurality. The LED 710 may generate and emit light when electric signals applied to the first wiring line 611 and the second wiring line 612, respectively, are further applied to the LED 710.

Unlike the wiring lines in the above-described embodiments, the first wiring line 611 and the second wiring line 612 may lengthwise extend in the same direction. The first and second wiring lines 611 and 612 may have a nanoribbon shape considering a shape thereof in the X-, Y- and Z-directions.

The first and second wiring lines 611 and 612 may each lengthwise extend over a plurality of island areas IA spaced apart from each other in a Y-direction of the display substrate 601. In another embodiment, the first and second wiring lines 611 and 612 may each lengthwise extend over a plurality of island areas IA spaced apart from each other in an X-direction of the display substrate 601.

The first wiring line 611 may be adjacent to the second wiring line 612 in the top plan view. A pair of first and second wiring lines 611 and 612 may be overlapping a single island area IA. The island area IA may be provided in plurality in a row of island areas (e.g., in the X-direction of FIG. 6) or in a column of island areas (e.g., in the Y-direction of FIG. 6). In an embodiment, a pair of first and second wiring lines 611 and 612 may overlap a single column of island areas as shown in FIG. 6. In similar fashion, although not shown, a pair of first and second wiring lines 611 and 612 may overlap a single row of island areas.

In an embodiment, to implement a display device having a stretchable structure, a portion of the wiring line 610 may be bent in the vertical (e.g., thickness) direction of the display substrate 601.

The first wiring line 611 includes a planar portion 613 provided in plurality and a first curved portion 614 connecting adjacent first planar portions 613 to each other. The first curved portion 614 may be defined by the first planar portion 613 bent in the upper direction of the display substrate 601 (e.g., the Z-direction). In an embodiment the first curved portion 614 is common to a pair of first planar portions 613 adjacent to each other along a length of the first wiring line 611. Where each of the planar portions 613 has a first and a second end which is opposite to the first end, the common first curved portion 614 extends from a first end of one of the pair of the adjacent first planar portions 613 and a second end of the other one of the pair of the adjacent first planar portions 613. In an embodiment, the first curved portion 614 may have an arch shape in cross-section showing the thickness direction of the display substrate 601. The first curved portion 614 may have elasticity.

Referring to FIGS. 6 and 7, the first planar portion 613 and the first curved portion 614 may be alternately arranged in a Y-direction of the display substrate 601. The first planar portion 613 and the first curved portion 614 may be formed as one body to define a single, unitary first wiring line 611. That is, one of the first planar portion 613 and the curved portion 614 may be extended to define the other one of the first planar portion 613 and the curved portion 614. The first planar portion 613 may be bonded to the island area IA of the display substrate 601. The first planar portion 613 and the display substrate 601 may form a first contact point 615 by an interface or a contact therebetween. The first curved portion 614 may be located between a plurality of island areas IA spaced apart from each other in the Y-direction of the display substrate 601. Opposing ends of the first curved portion 614 may be respectively disposed in adjacent island areas IA spaced apart from each other.

The second wiring line 612 includes a second planar portion 616 provided in plurality and a second curved portion 617 connecting adjacent second planar portions 616 to each other. The second curved portion 617 may be defined by the second planar portion 616 bent in the upper direction of the display substrate 601 (e.g., the Z-direction). In an embodiment, the second curved portion 617 may have an arch shape in cross-section. The second curved portion 617 may have elasticity.

Referring to FIGS. 6 and 7, the second planar portion 616 and the second curved portion 617 may be alternately arranged in the Y-direction of the display substrate 601 and may be formed as one body to define a single, unitary second wiring line 612. That is, one of the second planar portion 616 and the second curved portion 617 may be extended to define the other one of second planar portion 616 and the second curved portion 617. The second planar portion 616 may be bonded to the island area IA of the display substrate 601. The second planar portion 616 and the display substrate 601 may form a second contact point 618 by an interface or a contact therebetween. The second curved portion 617 may be located between a plurality of island areas IA spaced apart from each other in the Y-direction of the display substrate 601. Opposing ends of the second curved portion 617 may be respectively disposed in adjacent island areas IA spaced apart from each other.

A single LED 710 may be commonly disposed on the first curved portion 614 and the second curved portion 617 of different wiring lines. With respect to the first curved portion 614 and the second curved portion 617, a region of the display substrate 601 at which the LED 710 is electrically connected to the wiring lines may correspond to a pixel area PA.

The LED 710 includes a first contact electrode 711, a second contact electrode 712, and a p-n diode 713 between the first and second contact electrodes 711 and 712.

The p-n diode 713 includes a p-doped layer 714, an n-doped layer 715, and at least one quantum well layer 716 between the p-doped layer 714 and the n-doped layer 715.

The LED 710 may be a horizontal LED.

Both the first contact electrode 711 and the second contact electrode 712 may face the same direction relative to the p-n diode 713. Specifically, the first and second contact electrodes 711 and 712 may both be respectively arranged toward the first and second wiring lines 611 and 612 among sides of the LED 710. The first and second contact electrodes 711 and 712 may collectively include conductive paste or a conductive ball.

The p-doped layer 714 and the n-doped layer 715 may be arranged in the horizontal direction of the display substrate 601. The first contact electrode 711 may be under the p-doped layer 714, and the second contact electrode 712 may be under the n-doped layer 715.

The first contact electrode 711 may be electrically connected to the first curved portion 614, and the second contact electrode 712 may be electrically connected to the second curved portion 617. The connection of the first curved portion 614 and the first contact electrode 711, and the connection of the second curved portion 617 and the second contact electrode 712 may be performed by laser welding or ultrasonic welding.

Since the LED 710 is electrically connected to the wiring lines at the first and second curved portions 614 and 617 as described above, the first and second curved portions 614 and 617 may absorb impact that may occur during a transfer process of the LED 710 in manufacturing a display device.

FIGS. 9A to 9D are cross-sectional views sequentially illustrating an embodiment of a process of manufacturing a wiring line having a curved portion according to the invention.

Figure 9A:
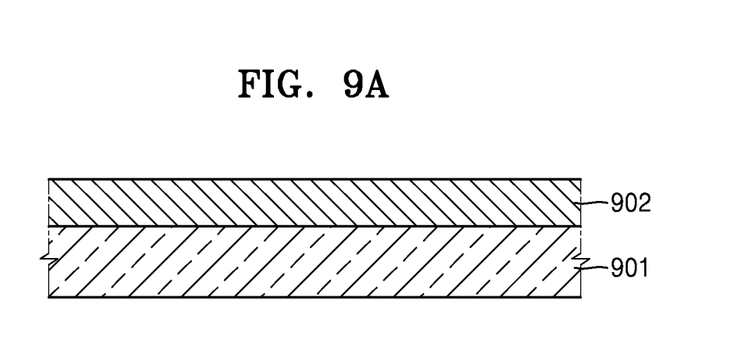
FIGS. 9A to 9D are cross-sectional views sequentially illustrating an embodiment of a process of manufacturing a wiring line including a curved portion according to the invention.

Referring to FIG. 9A, a base layer 902 is formed on a display substrate 901. Any material may be used for the base layer 902 as long as the material may be deformed or melted by applying predetermined heat. In an embodiment, the base layer 902 may be a polymer. In another embodiment, the base layer 902 may be a material that may be melted by using a solvent. The through hole described in FIG. 6 may be formed in a display substrate 901 in advance.

Figure 9B:
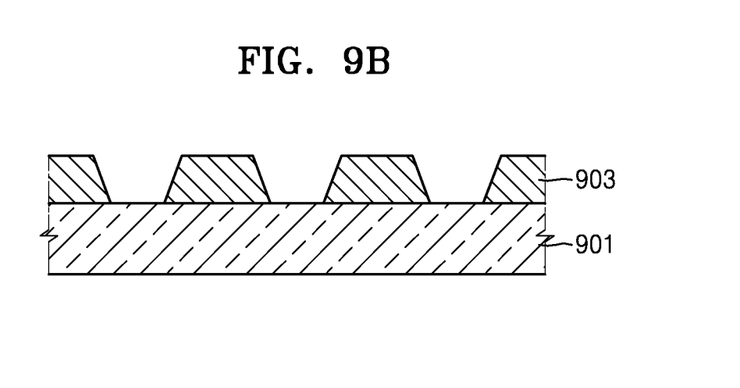

Referring to FIG. 9B, the base layer 902 is patterned such as by a photolithography method. A patterned base layer 903 may have the same pattern as the pattern of a wiring line. In FIG. 9B, patterns of the patterned base layer 903 are spaced apart from each other in the horizontal direction along the display substrate 901 by recesses defined therebetween. The horizontal direction in FIG. 9B may correspond to a length direction of a wiring line to be formed thereon.

Figure 9C:
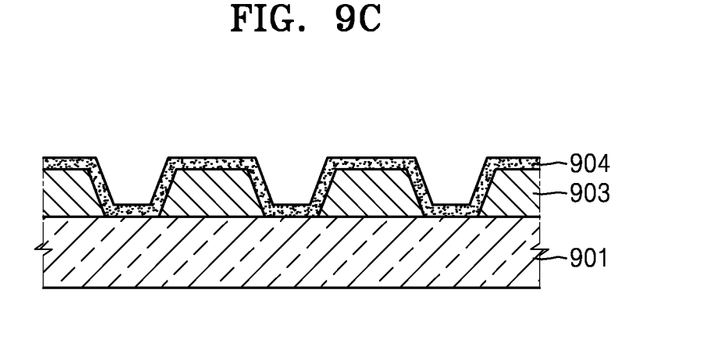

Referring to FIG. 9C, a wiring line 904 is formed on the patterned base layer 903 to extend across the patterns and recesses arranged in the horizontal direction. The wiring line 904 may include a metallic material having conductivity. The wiring line 904 may be deposited on the patterned base layer 903.

With the wiring line 904 formed on the patterned base layer 903 as described above, the underlying patterned base layer 903 may be removed by applying predetermined heat thereto. In another embodiment, with the wiring line 904 formed on the patterned base layer 903 as described above, the underlying patterned base layer 903 may be removed by using a solvent.

Figure 9D:
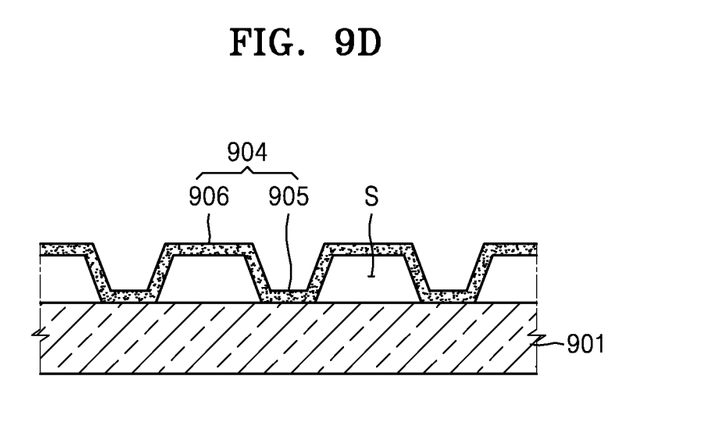

Referring to FIG. 9D, by removing of the patterned base layer 903, the wiring line 904 remains on the display substrate 901, the wiring line 904 having a plurality of planar portions 905 and a curved portion 906 connecting adjacent planar portions 905 to each other is formed on the display substrate 901. The planar portion 905 may be bonded on the display substrate 901. The curved portion 906 may be spaced apart in the upper (e.g., thickness) direction of the display substrate 901. Since a space S is formed between the display substrate 901 and the curved portion 906, the space S may absorb impact during a transfer process of an LED in manufacturing a display device.

As described above, one or more embodiment of a display device according to the invention may improve connection reliability between an LED and a wiring line which supplies signals or power to the LED.

What is claimed is:

1. A display device comprising:
   a display substrate including:
      pixel areas separated from each other, and
      a plurality of through holes separated from each other;
   a plurality of light-emitting diodes arranged in the pixel areas; and
   a wiring line connected to the plurality of light-emitting diodes,
   wherein
      a length of the wiring line extends in one direction of the display substrate, and
      the wiring line comprises arranged along the length thereof:
         a plurality of planar portions respectively contacting the display substrate, and
         a curved portion which connects adjacent planar portions to each other.

2. The display device of claim 1, wherein the curved portion protrudes from an end of each of the adjacent planar portions to be spaced apart from the display substrate in a thickness direction of the display substrate.

3. The display device of claim 2, wherein
   a light-emitting diode among the plurality of light-emitting diodes arranged in the pixel areas, is connected to the wiring line at the curved portion.

4. The display device of claim 3, wherein
   the light-emitting diode comprises a first contact electrode, a second contact electrode, and a p-n diode between the first contact electrode and the second contact electrode,
   the wiring line comprises a first wiring line and a second wiring line,
   the first wiring line comprises a first planar portion provided in plurality and a first curved portion which connects adjacent first planar portions to each other, the second wiring line comprises a second planar portion provided in plurality and a second curved portion which connects adjacent second planar portions to each other, and for a same light-emitting diode to which the first and second wiring lines are connected, the first curved portion is electrically connected to the first contact electrode of the same light-emitting diode, and the second curved portion is electrically connected to the second contact electrode of the same light-emitting diode.

5. The display device of claim 4, wherein the display substrate further comprises an island region at which the plurality of planar portions of the wiring line contacts the display substrate, and the first planar portion of the first wiring line and the second planar portion of the second wiring line are respectively bonded to the island region of the display substrate.

6. The display device of claim 3, wherein the wiring line comprises a first wiring line and a second wiring line, and in a pixel area among the pixel areas, a same one light-emitting diode among the plurality of light-emitting diodes is electrically connected to both the first wiring line and the second wiring line.

7. The display device of claim 1, wherein the curved portion is spaced apart from the display substrate along a thickness direction of the display substrate and corresponds to a through hole among the plurality of through holes.

8. The display device of claim 2, wherein the curved portion is provided in plurality alternating with the plurality of planar portions, and each of the light-emitting diodes is connected to the wiring line at a corresponding curved portion.

9. The display device of claim 6, wherein the same one light-emitting diode comprises a first contact electrode, a second contact electrode, and a p-n diode between the first contact electrode and the second contact electrode, and the first contact electrode is electrically connected to the first wiring line, and the second contact electrode is electrically connected to the second wiring line.

10. A display device comprising:

a display substrate bendable, curvable or rollable along a direction, the display substrate including:
   pixel area separated from each other, and
   a plurality of through holes separated from each other and each passing through a thickness of the display substrate;

a plurality of light-emitting diodes arranged in the pixel areas; and a wiring line provided in plurality comprising a first wiring line and a second wiring line, wherein a light-emitting diode among the plurality of light-emitting diodes is electrically connected to both the first wiring line and the second wiring line, and in a top plan view, each through hole among the plurality of through holes defines:
   a length which extends in the direction along which the display substrate is bendable, curvable or rollable,
   a width perpendicular to the length thereof, and
   opposing ends thereof along the length thereof,
   wherein the width of the each through hole at both of the opposing ends thereof is greater than the width at remaining portions of the each through hole.

11. A display device comprising:

a display substrate including:
   pixel area separated from each other, and
   a plurality of through holes separated from each other;

a light-emitting diode provided in plurality arranged in the pixel areas; and a wiring line connected to the plurality of light-emitting diodes, wherein the wiring line comprises a length along which are arranged curved portions spaced apart from each other, each of the curved portions spaced apart from the display substrate along a thickness direction of the display substrate, and the curved portions correspond to the plurality of through holes.

* * * * *